United States Patent

Steeg et al.

[11] Patent Number: 5,955,202
[45] Date of Patent: Sep. 21, 1999

[54] CONCAVE SLIDING ELEMENT AND PRODUCTION PROCESS THEREFOR

[75] Inventors: Michael Steeg, Ober-Olm; Klaus Goedicke, Dresden; Torsten Kopte, Dresden; Christoph Metzner, Dresden, all of Germany

[73] Assignee: Federal-Mogul Wiesbaden GmbH, Germany

[21] Appl. No.: 08/945,247

[22] PCT Filed: Apr. 19, 1996

[86] PCT No.: PCT/DE96/00729

§ 371 Date: Oct. 20, 1997

§ 102(e) Date: Oct. 20, 1997

[87] PCT Pub. No.: WO96/33352

PCT Pub. Date: Oct. 24, 1996

[30] Foreign Application Priority Data

Apr. 21, 1995 [DE] Germany ............................ 195 14 835

[51] Int. Cl.[6] ........................................ F16C 33/12
[52] U.S. Cl. .................... 428/457; 384/912; 427/569; 427/576; 427/585
[58] Field of Search ................... 428/469, 472, 428/457; 384/912; 427/569, 576, 585

[56] References Cited

U.S. PATENT DOCUMENTS

| | | | |
|---|---|---|---|
| 3,950,141 | 4/1976 | Roemer ................................. | 29/196.2 |
| 4,206,268 | 6/1980 | Roemer et al. ........................ | 426/643 |
| 4,363,854 | 12/1982 | Hodes et al. ......................... | 428/632 |
| 4,562,122 | 12/1985 | Hodes et al. ......................... | 428/644 |
| 4,830,933 | 5/1989 | Hodes et al. ......................... | 428/646 |
| 4,946,747 | 8/1990 | Bergmann et al. .................... | 428/653 |
| 4,957,822 | 9/1990 | Steeg et al. .......................... | 428/653 |
| 5,185,216 | 2/1993 | Tanaka et al. ........................ | 428/614 |
| 5,300,368 | 4/1994 | Kubert et al. ......................... | 428/610 |

FOREIGN PATENT DOCUMENTS 2187207  9/1987  United Kingdom .

Primary Examiner—Archene Turner
Attorney, Agent, or Firm—Jon E. Shackelford

[57] ABSTRACT

A curved sliding element for a plain bearing and a method of producing same. The sliding element includes a generally semi-circular backing member having a central apex and a concave surface. At least one, and preferably two, intermediate layers are applied to the concave surface of the backing member. A dispersion alloy overlay is applied to the exposed intermediate layer using an electron beam vaporizer. The electron beam vaporizer evenly deposits the dispersion alloy over an angular segment, approximately 70° on either side of the apex, in a such controlled manner that the thickness of the overlay deviates less than 15% across the entire angular segment. The vaporizer is moved during the overlay deposition in a linear path relative to the backing member while maintaining the distance from the linear path of the vaporizer to the apex between 150 to 350 mm. The relative speed between the vaporizer and the backing member can be varied to enhance deposition characteristics, such as by reducing the speed as the backing member nears the vaporizer and increasing the speed as the backing member moves away from the vaporizer. It may also be beneficial to position a screen between the linear path and the backing member. The screen includes a face presented toward the vaporizer which is maintained at a temperature above the melting point of the dispersion alloy.

23 Claims, 2 Drawing Sheets

CONCAVE SLIDING ELEMENT AND PRODUCTION PROCESS THEREFOR

BACKGROUND OF THE INVENTION

The invention relates to a concavely curved sliding element whose multilayer system, applied to a backing member in particular in a vacuum, comprises at least one overlay of a metallic dispersion alloy. Such sliding elements have acquired importance for example as highly loadable bearings or bearing liners in combustion engines. The invention further relates to a method of producing such sliding elements, which are also known as radial bearings.

1. Field of the Invention
2. Description of Related Art

In the case of radial bearings, the highest stress, i.e. abrasive loading, generally arises in the area of the apex of the bearing liner. In contrast, in the vicinity of the partial faces, i.e. the areas remote from the apex, wearing and dynamic loads are substantially less. Through preliminary mechanical work affecting the geometric shape, e.g. softening of the arcuate shape, it has been attempted, inter alia, to ensure the formation of an optimum lubricating film and embedding behaviour for foreign particles.

If differences in thickness between the apex area and the area of the partial faces arise during application of the multilayer system, the overlay deviates from the ideal circular shape. Through prior machining of the backing member, it is possible to compensate for this. However, this measure makes prior machining considerably more difficult and more expensive.

Bearing liners with uniform wall thicknesses may also be used for V-type engines and engines with obliquely divided connecting rods. The main load zone therein lies outside the apex area.

In the case of highly loadable sliding elements, it is known to apply the overlays by vacuum coating. Thus it is known to apply an Al—Sn—Cu—based overlay by atomisation (sputtering) (DE 28 53 724 C3; DE 29 40 376 A1; DE 37 29 414 A1).

It is also known to spray on layers with integral plastics particles (DE 29 14 618 C2).

Moreover, an atomising device specially conformed to the coating geometry of bearing liners or a device for accommodating backing members for the production of plain bearings by atomisation are known. In general, highly loadable overlays may be produced using the abovementioned materials applied by atomisation in a vacuum (AT-PS 392 291 B; EP 0 452 647 A1). However, owing to its working mechanism, atomisation is an expensive method because the deposition rate cannot be increased above a certain limit. This method therefore has narrow limits. On the other hand, atomisation had the advantage that uniform coating is possible even on curved components such as plain bearings.

It is also known to produce plain bearings from strip-form semi-finished products, wherein an overlay is applied to the strip by vacuum vapour-deposition (DE 36 06 529 C2; DE 29 35 417). The aim of this known method was more economical production of plain bearings. However, attempts to process a strip coated in this way further to form a plain bearing did not produce a usable result, because the high degree of deformation led to damage or breakages within the multilayer composite.

The problem on which the invention is based is that of so constructing the layers of a multilayer system of a highly loadable sliding element or plain bearing that the latter fulfil the requirements made thereof under all loads arising during operation and at the same time reducing manufacturing costs. An optimum lubricating film which has a substantial influence on service life is to be produced. The method is to be environmentally friendly, i.e. electroplating methods should be superseded at least in part, and highly productive.

SUMMARY OF THE INVENTION

The invention makes it possible, in the case of formed parts such as plain bearing liners, to retain a single prior machining operation and an economical, highly productive layer deposition method may be used, the use of which did not hitherto provide either the necessary layer uniformity or adequate layer properties. It has surprisingly been noted that sliding elements produced according to the invention surpass the properties and economy of those produced according to the previous prior art. In particular, such layers exhibit a substantially higher fatigue limit than layers applied by electroplating. Tests have thus shown that service life is substantially improved with respect to predetermined loads, if the overlay is produced by electron beam vapour-deposition. The following are decisive reasons therefor.

Owing to the energy conditions in vapour-deposition with a high deposition rate, extremely fine distribution of the dispersely incorporated components is achieved in the matrix of the dispersion alloy. The layer structure thereby arising ensures a very high load-bearing capacity, which rises as the layer thickness increases. The high level of uniformity of the layer thickness over a large area of the circumference ($\pm 70°$) of the bearing liner combined with the layer and grain structure obtainable by electron beam vapour-deposition ensures that the sliding elements are of high quality. It has a decisive effect on the formation of the lubricating film and the embedding capacity with respect to foreign particles and abrasion.

It has proven particularly advantageous to provide sliding elements such as radial bearings with a diffusion barrier layer between backing member and overlay and to apply this layer likewise by electron beam vaporisation. The thickness of said layer varies over an angular area of $\pm 70°$, based on the apex, by a maximum of $\pm 15$ %.

Metallic dispersion alloys, containing at least one metal from the group Al, Pb, Cd, Sn, Zn, Ni and Cu have proven especially suitable for the sliding element according to the invention. The dispersion alloy preferably comprises from 15 to 36 wt. % Sn and from 0.1 to 30. wt. % Cu and the balance Al.

The invention further provides a method of producing sliding elements comprising a multilayer system, wherein at least one layer is applied in a vacuum. After pretreatment known per se, at least the overlay is applied to the backing member by electron beam vapour-deposition from a vaporiser. The method is characterised in that the layer deposition is carried out under strictly defined geometric coating conditions and at a predetermined deposition speed. It has been shown that, by means of these method features, the formation of an overlay of optimum layer structure and a matrix with extremely finely distributed disperse components is achieved. In contrast with overlays produced by methods known hitherto, these exhibit a high load-bearing capacity and good tribological properties. In addition to deposition speed, the angle of incidence during vapour-deposition is also a decisive factor in the formation of the microstructure of said overlay and thus its properties.

The method according to the invention also has the advantage that the dispersion alloy for the overlay may be vappur-deposited from a vaporiser, it also being possible, however, for at least two components of the dispersion alloy to be vapour-deposited from individual vaporiser crucibles arranged close to each other.

The method of applying the overlay and/or the diffusion barrier layer by vapour-deposition may be effected reactively with the supply of a reaction gas and/or by plasma-activation. The method is substantially defined by the selection of the material to be vapour-deposited.

BRIEF DESCRIPTION OF THE DRAWINGS

The invention will be described in more detail with the aid of an exemplary embodiment and drawings, in which.

DETAILED DESCRIPTION OF THE PREFERRED EMBODIMENTS

Figure 1:
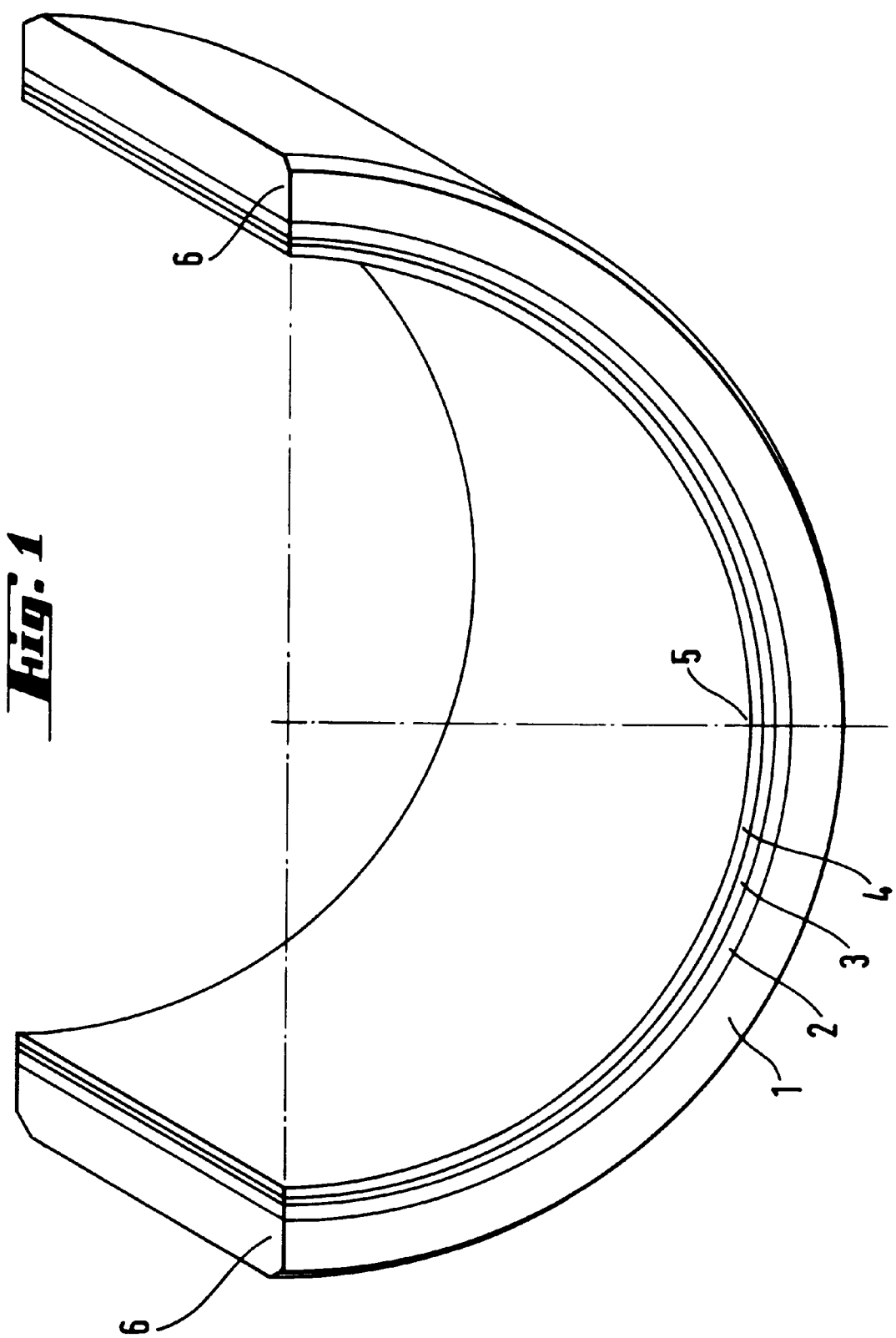
FIG. 1: is a perspective representation of a bearing liner.

FIG. 1 shows a curved sliding element in the form of a bearing liner having a backing strip or member 1 of steel pre-deformed with a generally semi-circular configuration presenting a concave inner surface, on which there are applied an intermediate layer 2 of lead bronze, a diffusion barrier layer 3 of nickel-chromium and an overlay 4 of aluminium-tin-copper. They form a multilayer system. The spread or thickness ratio of the multilayer system, essentially of the diffusion barrier layer 3 and the overlay 4 is such that, over an angular area of ±80°, based on the apex area 5, a deviation in layer thickness of less than 15%, based on the maximum layer thickness occurring in the apex area 5, is achieved. The backing member 1 and the intermediate layer 2 are also of continuous thickness with the layer 2 also having generally semi-circular configuration along with the overlay 4. The partial surfaces 6 form the edge of the bearing liner.

Figure 2:
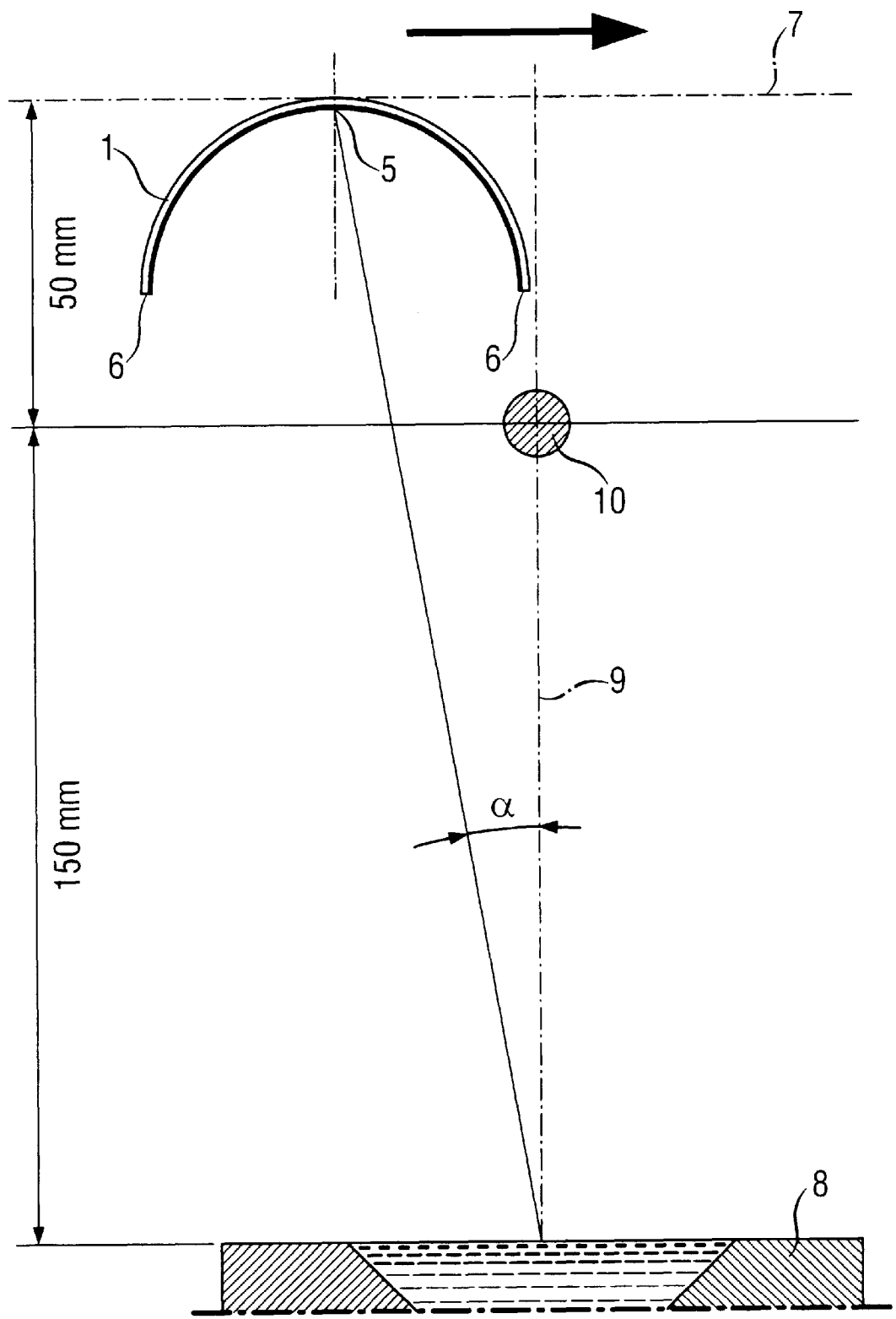
FIG. 2: is a schematic representation of a vaporiser device for bearing liners.

FIG. 2 serves to explain the method of producing bearing liners. The method is carried out as follows.

The intermediate layer 2 of lead bronze and the diffusion barrier layer 3 of nickel are applied in a known way to the curve backing strip 1 by electroplating, or the latter is applied by sputtering if it is of nickel-chromium. The coated backing member 1 is then degreased and cleaned.

The backing members thus pretreated are introduced into a vacuum vapour deposition installation and cleaned by a sputtering and etching process after evacuation thereof to a pressure of 0.01 Pa. The backing member 1 is firstly protected prior to vapour-deposition by a controllable screen (not shown).

At least one backing member 1 is moved over the vaporiser 8 in the direction of the arrows on a plane 7 parallel to the vaporiser bath surface. The backing member 1 is so arranged that its axial direction lies at right angles to the direction of movement on its linearly opposite ends (i.e., in line with the movement. The speed of linear movement is so controlled that it is greater upon entry into and exit from the vapour cloud than over the centre of the beam formed of vapour. The speed curve v(α) is continuous and in accordance with the equation:

$$v(\alpha) = v_{max} v - _0 \cdot \cos(2\alpha)$$

α is the angle between the line 9 normal to the centre of the vaporiser 8 and the apex area 5. The favourable range for the angle α is between −45° and +45°. $v_{max}$ is the maximum speed on entry into and exit from the vapour beam. Its value is approximately 1 m/min. $v_0$ is a normalising value. It ranges from 0.5 to 0.7 m/min.

The distance between the vaporiser crucible 8 and the plane 7 of the apex area 5 of the backing member 1 is set at 200 mm. The vaporiser crucible 8 is filled with material of the alloy AlSn20Cu0.25 for application of the overlay. It is heated by the electron beam of an axial electron gun (not shown). A known vaporisation process is used, which ensures extensive correspondence of the composition of the vaporising and layer materials. The vapour deposition rate in the plane 7 of the apex area 5 of the backing member 1 is set at 300 nm/s.

A 15 mm thick electrically heated rod 10 is arranged centrally between the vaporiser crucible 8 and the plane 7 of the apex area 5 at a height of 150 mm above the surface of the vaporiser crucible 8. The heated rod 10 acts as a vapour screen and has a surface temperature above the melting point of the vaporising product. In this way, marked condensation of vapour on the rod 10 is prevented.

By opening the screen and moving the backing member 1 into the vapour deposition zone (α=−45°), vapour deposition is initiated. When the vapour deposition zone is reached the backing member 1 is moved over the vaporiser crucible 8 in accordance with the above-described speed curve. After a period of 80 seconds, the screen is closed and vapour deposition broken off. Through the afore-mentioned setting of the coating parameters, in the case of backing members 1 with a radius of curvature of 25 mm a layer thickness of 18±1 μm is achieved in the apex area 5 and 17±1 μm in the area of the partial surfaces 6.

The layer thickness distribution thus corresponds to the above-mentioned requirement. The overlay 4 deposited under the conditions indicated by electron beam vapour-deposition fulfils the highest quality requirements.

To increase the productivity of the method, linear vaporisers are used in a known way, a plurality of sliding elements being simultaneously arranged thereabove next to each other in the axial direction.

It will be appreciated that by vacuum depositing the overlay in situ on the pre-deforrned concave inner surface of the backing strip 1 (as opposed to depositing the overlay on a flat backing strip and then deforming the strip and overlay to the semi-circular configuration) the binding stresses that would otherwise be imparted to the metal matrix composite overlay is avoided, thus precluding damage or breakage to the overlay.

According to a further aspect of the invention, where the dispersion alloy includes at least two different metal components, they may be vapor deposited from individually vaporized crucibles arranged close together.

Also, the overlay and/or diffrusion barrier layer may be vapor-deposited in a vacuum with or without a reactive atmosphere. When a reactive atmosphere is employed, it may comprise reactive gases such as oxygen, nitrogen, hydrocarbon compounds or a mixture of such gases and/or plasma-activation may be employed.

What is claimed is:

1. A curved sliding element comprising:
   a metallic backing strip (1) having a pre-deformed generally semi-circular plain bearing configuration presenting a concave inner surface having an apex (5);
   at lease one intermediate layer (2, 3) applied to said inner surface and having a generally semi-circular configuration; and
   an overlay (4) of a metallic dispersion alloy including at least one metal selected from the group consisting essentially of aluminum, cadmium, tin, zinc, nickel and copper, said overlay (4) being electron beam vapor deposited onto said intermediate layer (2, 3) so as to have a generally semi-circular configuration on said backing strip (1) in its as-deposited state, said overlay (4) having a generally uniform thickness along said backing strip (1) with less than 15% deviation over an angular segment of said backing strip (1) of about 70° on either side of said apex (5), said overlay (4) being substantially free of bending-induced stress that would otherwise result from bending said overlay (4) with said backing strip (1) to said generally semi-circular configuration of said overlay were applied before deforming said backing strip (1) to said generally semi-circular configuration.

2. A sliding element as set forth in claim 1 wherein one of said intermediate layers includes a diffusion barrier layer (3).

3. A sliding element as set forth in claim 2 wherein said diffusion barrier layer (3) is applied by electron beam vapor-deposition and has a thickness deviation of less than 15% at least over an angular segment of about 70° on either side of said apex (5).

4. A sliding element as set forth in claim 1 wherein said dispersion alloy includes from 15 to 35 wt. % tin and from 0.1 to 3 wt. % copper and aluminum.

5. A sliding element as set forth in claim 1 wherein said metallic dispersion alloy includes a metal matrix and at last one dispersion selected from the group consisting of oxide, nitride and carbide compounds.

6. A sliding element as set forth in claim 5 wherein said diffusion barrier layer (3) consists essentially of at least one of nickel, nickel/tin, nickel/copper, nickel/chromium, titanium, and titanium nitride.

7. A method of making a plain bearing comprising:

deforming a metallic backing strip (1) to a generally semi-circular configuration presenting a concave inner surface having an apex (5);

applying at least one intermediate metallic layer (2 ,3) to the inner surface of the backing strip (1) such that the intermediate layer is concave; and applying by electron beam deposition an overlay (4) of a metallic dispersion alloy to the concave intermediate layer to develop a generally uniform layer of the overlay material having less than 15% deviation over about 70° on either side of the apex (5), and selecting the metallic dispersion alloy to include at least one metal selected from the group consisting essentially of aluminum, cadmium, tin, zinc, nickel and copper.

8. A method of claim 7 wherein the backing strip (1) has linearly opposite ends and the deposition of the metallic dispersion alloy includes moving the backing strip (1) along a linear path between said ends relative to a vaporizer (8) and varying the relative speed to develop the generally uniform thickness application of the overlay material on the concave backing strip.

9. A method as set forth in claim 8 wherein said step of moving the vaporizer (8) and varying the relative speed includes reducing the speed as the backing member (1) nears the vaporizer (8) and increasing the speed as the backing member (1) moves away from the vaporizer (8).

10. A method as set forth in claim 8 wherein said step of forming the overlay (4) includes condensing the dispersion alloy adjacent the apex (5) at a rate of at least 80 nm/s.

11. A method as set forth in claim 8 further including the step of positioning a screen (10) between the linear path and the backing member (1).

12. A method as set forth in claim 11 wherein the screen (10) includes a face presented toward the vaporizer (8), further including maintaining the face of the vaporizer (8) at a temperature above the melting point of the dispersion alloy.

13. A method as set forth in claim 8 wherein the dispersion alloy includes at least two components, and wherein said step of forming the overlay (4) includes separately vaporizing the two components using proximally spaced respective electron beam vaporizers (8).

14. A method as set forth in claim 8 wherein said step of forming the overlay (4) includes vaporizing the dispersion alloy using a vaporizer crucible (8).

15. A method as set forth in claim 8 wherein said step of forming the overlay (4) includes vapor-deposition in a vacuum in the absence of a reactive gas.

16. A method as set forth in claim 8 wherein said step of applying the intermediate layer (2, 3) includes vapor-deposition in a vacuum in the absence of a reactive gas.

17. A method as set forth in claim 8 wherein said step of forming the overlay (4) includes reactive application by at least one of a reactive gas and plasma-activation.

18. A method as set forth in claim 17 wherein said reactive application includes at least one of oxygen, nitrogen and hydrocarbon compounds.

19. A method as set forth in claim 7 wherein said step of applying the intermediate layer (2, 3) includes reactive application by at least one of a reactive gas and plasma-activation.

20. A method as set forth in claim 19 wherein said reactive application includes at least one of oxygen, nitrogen and hydrocarbon compounds.

21. A method as set forth in claim 7 wherein said step of applying the intermediate layer (2, 3) includes atomizing a diffusion barrier layer (3) prior to said step of forming the overlay (4), said step of forming the overlay (4) including establishing a vacuum cycle about the electron beam vaporizer (8).

22. A method of claim 8 including maintaining a distance from the vaporizer to the apex (5) of about 150 to 350 mm.

23. A method of claim 22 including controlling the relative speed of movement V(2) such that $V(2)=V_{max}-V_0 \cdot \cos(2\alpha)$, wherein $\alpha$ is the angle formed between a line (9) normal to the center of the vaporizer (8) and a line between the apex (5) and the vaporizer (8), $V_{max}$ is the maximum speed upon entry and exiting of the backing strip into an effective vapor beam zone, and $V_0$ is a normalizing value ranging from 0.5 to 0.7 m/min.

* * * * *